(12) United States Patent
Siau et al.

(10) Patent No.: US 7,830,701 B2
(45) Date of Patent: Nov. 9, 2010

(54) CONTEMPORANEOUS MARGIN VERIFICATION AND MEMORY ACCESS FOR MEMORY CELLS IN CROSS POINT MEMORY ARRAYS

(75) Inventors: Chang Hua Siau, San Jose, CA (US); Christophe J. Chevallier, Palo Alto, CA (US)

(73) Assignee: Unity Semiconductor Corporation

( * ) Notice: Subject to any disclaimer, the term of this patent is extended or adjusted under 35 U.S.C. 154(b) by 217 days.

(21) Appl. No.: 12/284,227

(22) Filed: Sep. 19, 2008

(65) Prior Publication Data
US 2010/0073990 A1    Mar. 25, 2010

(51) Int. Cl.
G11C 11/00    (2006.01)
(52) U.S. Cl. .................................. 365/148; 365/189.07
(58) Field of Classification Search .................. 365/148, 365/189.07
See application file for complete search history.

(56) References Cited

U.S. PATENT DOCUMENTS

| 5,359,205 | A * | 10/1994 | Ovshinsky ..................... 257/3 |
|---|---|---|---|
| 6,317,375 | B1 | 11/2001 | Perner |
| 6,331,944 | B1 | 12/2001 | Monsma et al. |
| 6,504,221 | B1 | 1/2003 | Tran et al. |
| 6,608,773 | B2 | 8/2003 | Lowrey et al. |
| 6,667,900 | B2 | 12/2003 | Lowrey et al. |
| 6,707,712 | B2 | 3/2004 | Lowery |
| 6,717,874 | B1 | 4/2004 | Perner et al. |
| 6,751,147 | B1 | 6/2004 | Smith et al. |
| 6,754,107 | B2 | 6/2004 | Khouri et al. |
| 6,813,177 | B2 | 11/2004 | Lowrey et al. |
| 6,826,094 | B1 | 11/2004 | Perner et al. |
| 6,836,422 | B1 | 12/2004 | Perner et al. |
| 6,847,544 | B1 | 1/2005 | Smith et al. |
| 6,865,104 | B2 | 3/2005 | Perner |
| 6,885,573 | B2 | 4/2005 | Sharma et al. |
| 6,894,938 | B2 | 5/2005 | Smith et al. |
| 6,898,134 | B2 | 5/2005 | Smith et al. |
| 6,940,744 | B2 | 9/2005 | Rinerson et al. |
| 6,999,366 | B2 | 2/2006 | Perner et al. |
| 7,020,006 | B2 | 3/2006 | Chevallier et al. |
| 7,038,948 | B2 | 5/2006 | Hamilton et al. |
| 7,042,757 | B2 | 5/2006 | Perner |

(Continued)

OTHER PUBLICATIONS

U.S. Appl. No. 12/332,136, filed Jul. 31, 2008, Chevallier et al.

(Continued)

Primary Examiner—Tuan T. Nguyen

(57) ABSTRACT

Circuitry and methods for restoring data values in non-volatile memory are disclosed. An integrated circuit includes a memory access circuit and a sensing circuit configured to sense a data signal during a read operation to at least one two-terminal non-volatile cross-point memory array. Each memory array includes a plurality of two-terminal memory cells. A plurality of the memory arrays can be fabricated over the substrate and vertically stacked on one another. Further, the integrated circuit can include a margin manager circuit configured to manage a read margin for the two-terminal memory cells substantially during the read operation, thereby providing for contemporaneous read and margin determination operations. Stored data read from the two-terminal memory cells may have a value of the stored data restored (e.g., re-written to the same cell or another cell) if the value is not associated with a read margin (e.g., a hard programmed or hard erased state).

17 Claims, 14 Drawing Sheets

U.S. PATENT DOCUMENTS

| | | | |
|---|---|---|---|
| 7,046,043 B2 | 5/2006 | Shibata et al. | |
| 7,057,258 B2 | 6/2006 | Tran et al. | |
| 7,068,204 B1 | 6/2006 | Bathul et al. | |
| 7,075,817 B2 | 7/2006 | Rinerson et al. | |
| 7,079,436 B2 | 7/2006 | Perner et al. | |
| 7,102,948 B2 | 9/2006 | Perner | |
| 7,164,599 B2 * | 1/2007 | Hosotani et al. | 365/158 |
| 7,372,753 B1 | 5/2008 | Rinerson et al. | |
| 7,379,364 B2 | 5/2008 | Siau et al. | |
| 7,706,167 B2 * | 4/2010 | Toda et al. | 365/148 |
| 2003/0058728 A1 | 3/2003 | Tran et al. | |
| 2003/0103400 A1 | 6/2003 | Tran et al. | |
| 2004/0125653 A1 | 7/2004 | Tran et al. | |
| 2004/0160797 A1 | 8/2004 | Tran et al. | |
| 2006/0034124 A1 | 2/2006 | Guterman et al. | |
| 2006/0039191 A1 | 2/2006 | Perner et al. | |
| 2006/0044878 A1 | 3/2006 | Perner et al. | |
| 2006/0050551 A1 | 3/2006 | Perner | |
| 2006/0050552 A1 | 3/2006 | Perner et al. | |
| 2006/0050582 A1 | 3/2006 | Perner et al. | |
| 2007/0159904 A1 | 7/2007 | Tran et al. | |
| 2007/0285971 A1 * | 12/2007 | Toda et al. | 365/148 |
| 2008/0025079 A1 | 1/2008 | Philipp et al. | |
| 2008/0144357 A1 | 6/2008 | Siau et al. | |
| 2008/0159046 A1 | 7/2008 | Rinerson et al. | |

OTHER PUBLICATIONS

U.S. Appl. No. 12/001,952, filed Dec. 12, 2007, Norman.

Noboru Sakimura, et al, "A 512Kb Cross-Point Cell MRAM", IEEE International Solid-State Circuits Conference, 2003, paper 16.1.

U.S. Appl. No. 12/221,136, filed Jul. 31, 2008, Chevallier et al.

* cited by examiner

900

| Sequential Sensing Samples 910 | Cell State 920 |
|---|---|
| 111 111 111 111 | 11 state |
| 011 111 111 111 | 11 state |
| 001 111 111 111 | 11 state, need restore |
| 000 111 111 111 | 10 state, need restore |
| 000 011 111 111 | 10 state |
| 000 001 111 111 | 10 state, need restore |
| 000 000 111 111 | 00 state, need restore |
| 000 000 011 111 | 00 state |
| 000 000 001 111 | 00 state, need restore |
| 000 000 000 111 | 01 state, need restore |
| 000 000 000 011 | 01 state |
| 000 000 000 001 | 01 state |

930  932  934  936

FIG. 9

CONTEMPORANEOUS MARGIN VERIFICATION AND MEMORY ACCESS FOR MEMORY CELLS IN CROSS POINT MEMORY ARRAYS

CROSS-REFERENCE TO RELATED APPLICATIONS

This application is related to U.S. patent application Ser. No. 11/095,026, filed Mar. 30, 2005, published as U.S. Pub. No. 20060171200, and entitled "Memory Using Mixed Valence Conductive Oxides," and to U.S. patent application Ser. No. 11/583,676, filed Oct. 19, 2006 and entitled "Two-Cycle Sensing In A Two-Terminal Memory Array Having Leakage Current", now U.S. Pat. No. 7,372,753, all of which are herein incorporated by reference in their entirety for all purposes.

FIELD

The present invention relates generally to memory technology. More specifically, the present invention relates to data retention in non-volatile memory.

BACKGROUND

Non-volatile memory is a type of data storage device in which stored data is retained in the absence of power. That is, data that was previously written to the non-volatile memory remains stored in the memory without substantial degradation of the value of the stored data after electrical power is removed from the non-volatile memory. However, some forms of non-volatile memory may be susceptible to degradation of the value of stored data due to several factors including passage of time, disturbs caused by successive read operations to a non-volatile memory cell, disturbs caused by half-select voltages applied to non-volatile memory cells, just to name a few. For example, disturbances in a non-volatile two-terminal cross-point memory array can degrade the margins, such as read margins, associated with non-volatile two-terminal memory cells positioned in the array, thereby leading to corrupted data or incorrect data being read from the array. Margins often describe the tolerance for a memory cell to provide accurate data (e.g., data representing values for a logic "0" or a logic "1") during, for example, a read operation when the memory cells are exposed to memory disturb effects caused by the application of a read voltage across the two terminals of the memory cell. Generally, data retention is the ability of the memory to retain stored data without corruption of the stored data due to any number of effects including but not limited to the aforementioned passage of time or disturbs to the memory cells caused by applied voltages.

To maintain appropriate read margins in environments that degrade memory cells, some conventional approaches test whether a specific memory cell can deliver voltages and/or currents that satisfy margin requirements during a margin test operation. Usually, the margin test operation is performed as a separate process that consumes memory support circuitry resources during the margin testing, typically at the expense of other memory device processes. Further, conventional approaches typically require dedicated sense amplifiers and reference cells to determine the read margins. Thus, the drawbacks to conventional approaches usually include an increased amount of circuitry and/or delayed memory operations (e.g., reading and writing) due to the margin testing. As one example, for memory cells that store data as a resistance value where a logic "0" is a high resistance (e.g., 10 MΩ) and a logic "1" is a low resistance (e.g., 100 kΩ), for a constant value of a read voltage (e.g., 3 V), a low read current will flow through a memory cell storing the high resistance logic "0" and a high read current will flow thorough a memory cell storing the low resistance logic "1". Accordingly, circuitry, such as a sense amp, can determine the value of stored data in a memory cell by sensing the magnitude of read current flowing through the memory cell during a read operation. However, if the resistance values for logic "0" and logic "1" drift in value and/or are corrupted by disturbs, then the magnitude of the read currents will also be affected and the sense amp may not be able to accurately determine the value of the stored data. Consequently, incorrect data values may be obtained during read operations to the memory due to corrupted data.

There are continuing efforts to improve data retention in non-volatile memory.

BRIEF DESCRIPTION OF THE FIGURES

The invention and its various embodiments are more fully appreciated in connection with the following detailed description taken in conjunction with the accompanying drawings, in which:

FIG. 9 depicts an exemplary state table for the timing diagram shown in FIG. 8.

Like reference numerals refer to corresponding parts throughout the several views of the drawings and the drawings are not necessarily to scale.

DETAILED DESCRIPTION

Figure 1:
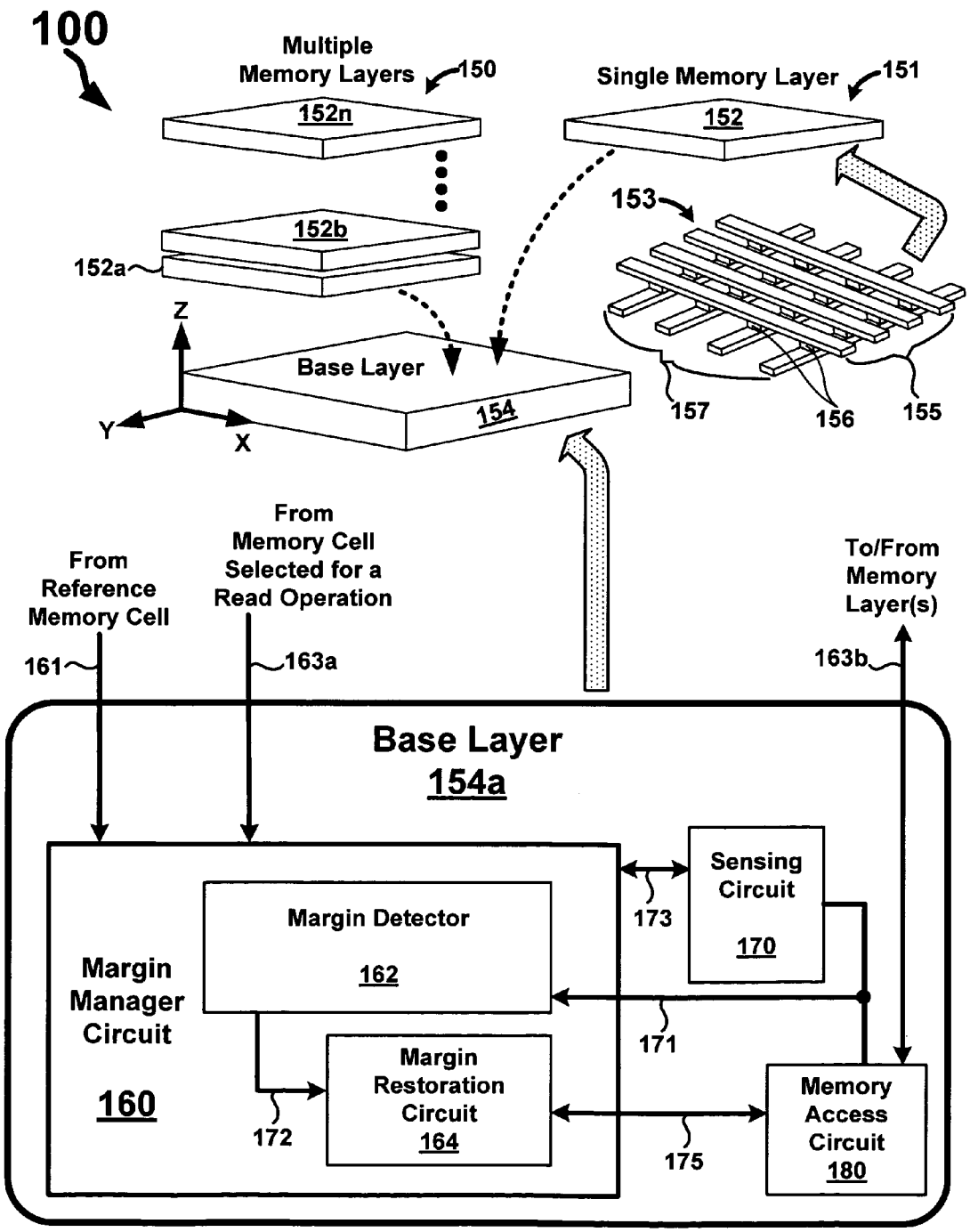
FIG. 1 depicts an integrated circuit including a margin manager circuit for managing margins for re-writable memory cells disposed in a single layer or in multiple layers of memory.

Various embodiments or examples of the invention may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

U.S. patent application Ser. No. 11/095,026, filed Mar. 30, 2005 and entitled "Memory Using Mixed Valence Conductive Oxides," is hereby incorporated by reference in its entirety for all purposes and describes non-volatile third dimensional memory elements that may be arranged in a two-terminal, cross-point memory array. In at least some embodiments, a two-terminal memory element can be configured to change conductivity when exposed to an appropriate voltage drop across the two terminals of the memory element. The memory element can include an electrolytic tunnel barrier and a mixed valence conductive oxide. Application of a write voltage of appropriate magnitude and polarity across the two terminals of the memory is operative to generate an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen (PCMO) perovskites and lanthanum-nickel-oxygen (LNO) perovskites) change valence, their conductivity changes. Additionally, oxygen accumulation in certain electrolytic tunnel barriers (e.g., yttrium stabilized zirconia (YSZ) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms can be reversible if the excess oxygen from the electrolytic tunnel barrier flows back into the mixed valence conductive oxide. A memory can be designed to exploit tunnel barrier height modification, tunnel barrier width modification, or both.

Both the electrolytic tunnel barrier and the mixed valence conductive oxide do not need to operate in a silicon substrate, and, therefore, can be fabricated above circuitry formed on the substrate, such as memory access circuits for performing data operations on the cross-point array(s) and/or circuitry being used for other purposes. Further, a two-terminal memory element can be arranged as a cross point such that one terminal is electrically coupled with an X-direction line (or an "X-line") and the other terminal is electrically coupled with a Y-direction line (or a "Y-line"). A third dimensional memory can include multiple memory elements vertically stacked upon one another, sometimes sharing X-direction and Y-direction lines in a layer of memory, and sometimes having isolated lines. When a first write voltage VW1, is applied across the memory element (e.g., by applying ½ VW1 to the X-direction line and ½-VW1 to the Y-direction line), the memory element can switch to a low resistive state. When a second write voltage, VW2, is applied across the memory element (e.g., by applying ½ VW2 to the X-direction line and ½-VW2 to the Y-direction line), the memory element can switch to a high resistive state. Memory elements using electrolytic tunnel barriers and mixed valence conductive oxides can have VW1 opposite in polarity from VW2.

FIG. 1 depicts an integrated circuit 100 including a margin manager circuit for managing margins for re-writable memory cells disposed in a single layer 151 or in multiple layers of memory 150, according to various embodiments of the invention. In this example, integrated circuit 100 is shown to include either multiple layers 150 of memory (e.g., layers 152a, 152b, ... 152n) or a single layer 151 of memory 152 formed on a base layer 154 (e.g., a silicon wafer). In at least some embodiments, each layer 152 of memory can be associated with a cross point array 153 that includes conductive array lines (155, 157) arranged in different directions (e.g., substantially orthogonal to one another) to access memory elements 156, which can be two-terminal memory cells. For example, conductors 155 can be X-direction array lines (e.g., row conductors) and conductors 157 can be Y-direction array lines (e.g., column conductors). In some embodiments, a two-terminal memory cell can have a programmable resistivity operative to store data as a plurality of conductivity profiles. Base layer 154 can include a bulk semiconductor substrate upon which circuitry, such as memory access circuits, can be formed. In at least some embodiments, base layer 154 can be configured as base layer 154a upon which circuitry including but not limited to a margin manager circuit 160, a sensing circuit 170 and a memory access circuit 180 are formed. Memory access circuit 180 can be configured to perform various memory access operations, such as write operations, read operations, and restore operations in association with re-writable memory cells. Margin manager circuit 160 is electrically coupled with a reference signal 161 from a reference memory cell and a data signal 163a from a memory cell selected for a read operation. Sensing circuit 170 can be configured to receive a data signal 163a via path 173 during a memory access operation, such as a read operation, to determine the state of the data stored in the selected memory cell. Sensing circuit 170 can also be configured to receive the reference signal 161 via path 173. The path 173 can be a single interconnect structure or can be a bus structure that supports multiple interconnects. In at least some embodiments, the data signal 163a (e.g., a read current) can be indicative of the value of stored data in the selected memory cell (e.g., one of the plurality of conductivity profiles). Margin manager circuit 160 can be configured to manage a margin, such as a read margin, for a memory cell. In at least some embodiments, margin manager circuit 160 can be configured to manage the read margin as a function of time.

As shown, margin manager circuit 160 can include a margin detector 162 and margin restoration circuit 164. Margin detector 162 can be configured to detect via path 171 whether the re-writable memory cell is associated with a specified level of read margin for a value (e.g., a logic value) representative of a state of stored data. Responsive to the detection of a non-specified level of read margin by margin detector 162, margin restoration circuit 164 can be configured to re-write a state into re-writable memory cell to restore the read margin to the specific level of read margin. In at least some embodiments, margin manager circuit 160 can be configured to contemporaneously detect read margins requiring restorations and to read data from the re-writable memory cells, and can be further configured to restore the read margin at any time after a read operation has been initiated by, for example, memory access circuit 180. Margin restoration circuit 164 can communicate at least one control signal via path 175 to activate memory access circuit 180, the control signal optionally including the value to be written in the memory cell in order to restore the read margin. In at least some embodiments, margin manager circuit 160 can be configured to control sensing circuit 170 (e.g., via path 173) to determine the read margin and to read the value of the stored data out from the re-writable memory cell.

In view of the foregoing, the structures and/functionalities of integrated circuit 100 can provide for contemporaneous (or substantially contemporaneous) margin detection and read operation. By combining margin detection and read operation processes, margin manager circuit 160 can thereby facilitate a reduction of memory accesses that otherwise might be performed for a dedicated margin testing operation. Further, multiplicative sensing circuits 170 need not be implemented to perform margin testing operations since manager circuit 160 can control sensing circuit 170 to both determine the read margin and read data values of the stored data.

As used herein, the term "specified level" can refer, at least in some embodiments, to a threshold (or a range) that specifies a margin, such as a read margin, whereby a memory cell being associated with a read margin can be consider as having a sufficient margin if the memory cell surpasses a specified level. A threshold (or a range) can be expressed in terms of parameter values or magnitudes of the data signal, such as voltages, currents, resistances, etc. When a memory cell is associated with a specified level of read margin, the memory cell can be described as being in a "hard" state. That is, it is either sufficiently programmed or sufficiently erased to provide data signals that can accurately convey the state of stored data in the memory cell. By contrast, if the memory cell is not associated with specified level of read margin (or is associated with a different range), then the memory cell can be described as being in a "soft state." That is, the memory cell is not sufficiently programmed or not sufficiently erased. Thus, the data signal may not provide an accurate representation of the state of stored data in the memory cell, as sensed by sensing circuit 170. In at least some embodiments, a specified level of read margin can refer to a specific resistance value as a threshold, or a range of resistance values that represent either a programmed state or an erased state, whereas another range of resistance values can be indicative of not having a specified level of read margin for either a programmed state or an erased state.

In at least some embodiments, margin manager 160 can be configured to determine whether a value of resistance (e.g., as indicated by a data signal) is associated with a first range of resistances that specify a read margin. For example, the first range of resistances can indicate a hard state for a state stored in the memory cell, whereby the stored state is solidly programmed or erased. Thus, a hard state can be either a "hard programmed state" if a data signal specifies a value indicating a programmed value (e.g., such as "0"), or a "hard erased state" if the data signal specifies a value indicating an erased value (e.g., such as "1"). Generally, hard states can be relatively immune to read failure due to disturb-related effects or other extraneous factors. But note that margin manager 160 can be configured to determine whether the value of resistance is associated with a second range of resistances for the read margin. Further to the example, consider that the second range of resistances can indicate a soft state for a state stored in the memory cell, whereby the stored state is weakly programmed or erased. Thus, a soft state can be a "soft programmed state" if the data signal specifies a programmed value (e.g., such as "0") for the second range of resistances, or a "soft erased state" if the data signal specifies an erased value (e.g., such as "1") for the same range of resistances. Generally, the soft programmed state and soft erased state can be relatively susceptible to read failure due to disturb-related effects or other extraneous factors. Margin restoration circuit 164 can be configured to change an association for the re-writable memory cell to the first range of resistances (e.g., to a hard state) from the second range of resistances (e.g., from a soft state), thereby restoring the read margin to a specified level of read margin. As used herein, the term "state" can refer, at least in some embodiments and contexts, to the datum or data stored in a memory cell. For example, a state can be a logic value of "0" or "1" for a single bit of data or can include logic values for data, such as "00", "01", "10", and "11" for a memory cell that stores multi-bit data, that is two or more bits of data. As used herein, the term "value" can refer, at least in some embodiments and contexts, to a quantity or amount of some parameter, such as a value of resistance that represents the presumed state of stored data in a memory cell. The states of "0" and "1" can be represented by values (e.g., magnitudes of currents) that correspond to, and are sensed as, "0" and "1", by circuitry, such as the sensing circuit 170, for example. However, disturb effects can cause a value to degrade thereby causing the value to represent the wrong state. For example, consider the case in which a programmed cell (e.g., having a logic value of "0") experiences disturb-related effects and the read margin becomes insufficient. Thus, the value of the programmed cell may represent an incorrect state (i.e., the value might incorrectly indicate that the memory cell includes a logic value of "1", which is incorrect and contrary to the logic "0" state that actually was programmed. In essence, degradation can lead to data corruption if steps are not taken to maintain read margins within acceptable levels.

Figure 2:
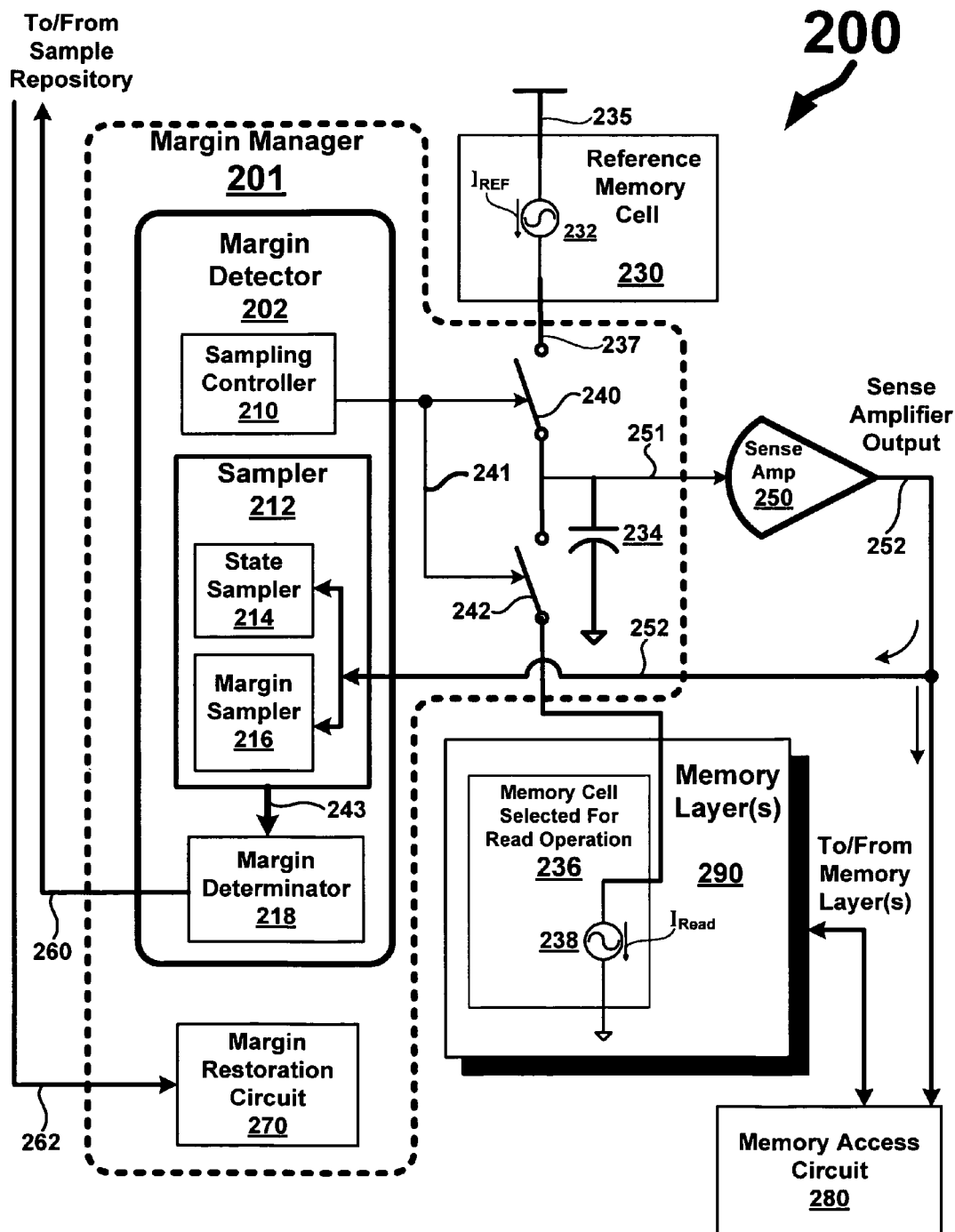
FIG. 2 depicts a portion of an integrated circuit including a margin manager circuit.

FIG. 2 illustrates a portion of an integrated circuit including a margin manager circuit, according to various embodiments of the invention. In this example, portion 200 of an integrated circuit is shown to include a margin manager 201, at least one reference memory cell 230 and a memory cell 236 (e.g., selected for a read operation) positioned in one or more layers of memory 290, a sense amplifier 250, and a memory access circuit 280 configured to perform read and write operations, as well as any other type of memory access operations. In at least some embodiments, reference memory cell 230 can be configured to generate a reference signal representing a reference current. The reference current can be generated by applying a voltage of a predetermined magnitude and polarity across terminals (235, 237) of the reference memory cell 230. For example, the applied voltage can be the read voltage that is applied across the selected memory cell 236 during a read operation. In some embodiments, the reference current may be included with other currents such as leakage currents and/or half-select currents generated by other memory cells during data operations. As one example, the leakage currents may be generated by the same group of memory cells during a data operation, such as a group of un-selected memory cells positioned on the same column or row as a selected memory cell during a read operation. Thus, reference memory cell 230 can be modeled as a reference current source 232 (or a sink, in some cases). Similarly, memory cell 236 can be configured to generate a signal representing a current, which can be combined with other currents such as leakage currents (e.g., leakage currents identical to those generated by the above mentioned group of memory cells) and/or half-select currents generated by other memory cells during data operations. Those currents may compensate for the extraneous currents associated with the reference current. Thus, memory cell 236 can be modeled as a current sink 238 (or a source, in some cases). U.S. patent application Ser. No. 11/583,676, filed Oct. 19, 2006 and entitled "Two-Cycle Sensing In A Two-Terminal Memory Array Having Leakage Current", now U.S. Pat. No. 7,372,753, and already incorporated herein by reference, describes circuitry and methods for sensing the value of stored data in a memory cell (e.g., as a read current) using leakage current subtraction in one embodiment to subtract leakage currents generated by un-selected memory cells that are on the same row or column as the selected memory cell. Sensing occurs in two cycles, where in one cycle, the sensed current is a total current comprised of the read current plus the leakage currents (e.g., from a first memory structure including the selected memory cell and un-selected memory cells) and in a second cycle, the sensed current comprises the leakage currents (e.g., from a second memory structure including the reference memory cell and un-selected memory cells). The currents sensed during the two cycles are subtracted to generate a data signal that is compared with a reference signal generated by a reference cell. A comparison circuit outputs a value indicative of the data stored in the selected memory cell. For example, the data signal and reference signal may be currents that are converted into voltages by I/V converters. The voltages from the I/V converters are compared to each other and if the voltage for the data signal is greater than the voltage for the reference signal, then the comparison circuit outputs a first voltage indicative of a first logic value (e.g., a logic "0"). On the other hand, if the voltage for the data signal is less than the voltage for the reference signal, then the comparison circuit outputs a second voltage indicative of a second logic value (e.g., a logic "1"). Currents generated by the reference cell and currents flowing in the row and/or column lines of the selected memory cell can be sensed by current mirror circuits that are electrically in series with the reference cell and the row and/or column lines.

In regard to the aforementioned first and second memory structures, the selected memory cell and the un-selected memory cells can be positioned on the same row or column of a two-terminal cross-point memory array. As one example, for the first memory structure, the selected memory cell can have one of its terminals electrically coupled with a selected row conductive array line and the other terminal electrically coupled with a selected column conductive array line. The un-selected memory cells can have one of their terminals electrically coupled with the same column conductive array line as the selected memory cell and the other of their terminals electrically coupled with a different row conductive array line.

As another example, for the second memory structure, the un-selected memory cells can have their terminals electrically coupled as described in the above example; however, the second memory structure may include the reference memory cell. The terminals of the un-selected memory cells that are electrically coupled with the same column conductive array line as the selected memory cell and one of the terminals of the reference memory cell may be electrically coupled with the same voltage potential (e.g., a bias voltage that may be initially 0V and rise to a voltage of about 100 mV to about 200 mV). The other terminal of the reference memory cell may be electrically coupled with another voltage potential, such as a reference voltage or may be allowed to float, for example. In some applications, the reference voltage may be a read voltage potential or some other reference level voltage.

Figure 2A:
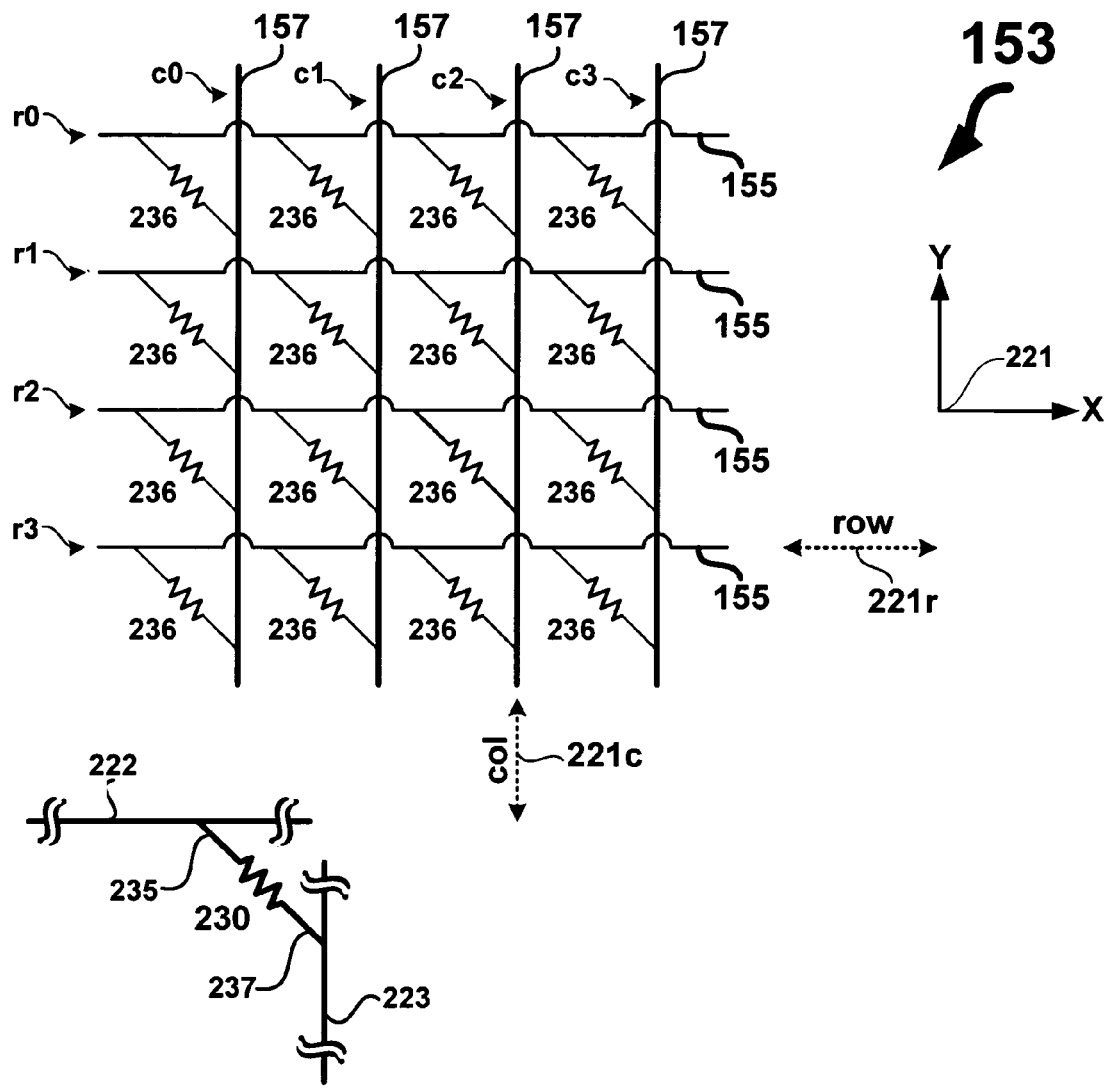
FIG. 2A depicts a schematic view of at least a portion of a memory array including a plurality of memory cells and optionally, at least one reference cell.

Reference is now made to FIG. 2A where the cross-point array 153 is depicted in schematic form. For purposes of illustration, the array 153 includes four rows oriented in a row direction 221r (r0, r1, r2, r3) that is aligned with an X-axis of coordinate system 221 and four columns oriented in a column direction 221c (c0, c1, c2, c3) that is aligned with a Y-axis of 221. There are 16 memory cells 236 positioned at a cross-point of one of the row conductors 155 with one of the column conductors 157. One terminal of each memory cell 236 is connected to only one of the row conductors 155 and the other terminal of each memory cell 236 is connected to only one of the column conductors 157. The array 153 may include at least one reference cell 230 with its terminal (235, 237) electrically coupled with conductive lines 222 and 223 respectively. The at least one reference cell 230 may be positioned external to the array 153 or may be positioned in a row or column of the array 153 as will be described in greater detail below.

Figure 2B:
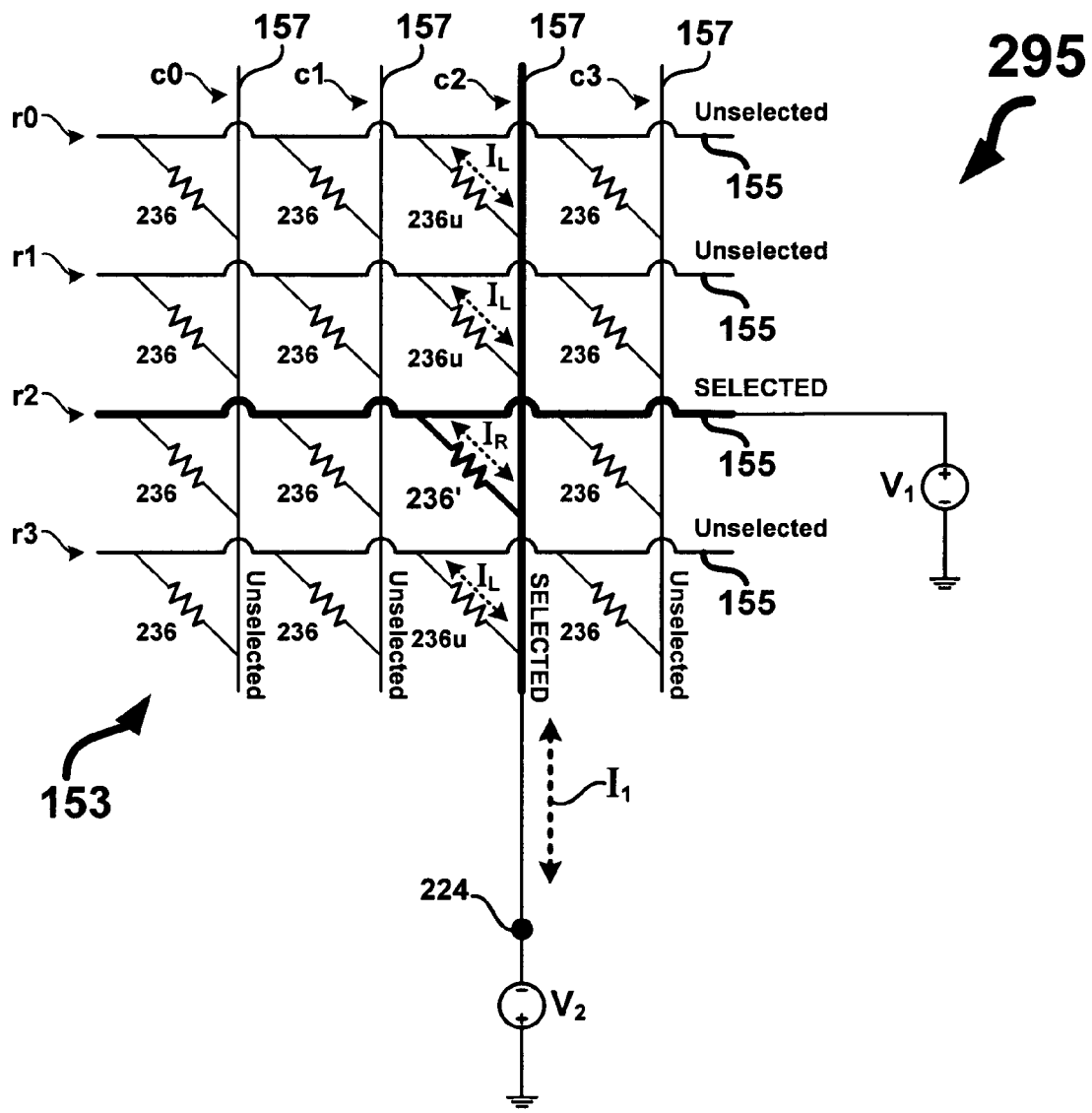
FIG. 2B depicts a schematic view of one example of a first memory structure during a first phase of a data operation for the array depicted in FIG. 2A.

Turning now to FIG. 2B, during a first phase of a data operation (e.g., a read margin determination) a first memory structure 295 includes a selected memory cell denoted as 236' positioned in row r2 and column c2. Other un-selected memory cells in the same column c2 as the selected memory cell 236' are denoted as 236u. Each un-selected memory cell 236u has one terminal electrically coupled with the same column conductor 157 as the selected memory cell 236' and the other terminal electrically coupled with a row conductor 155 that is different than the row conductor 155 for selected memory cell 236'. During the first phase, voltage potentials $V_1$ and $V_2$ are applied to the row and column conductors 155 and 157 (shown in heavy line) for r2 and c2 such that the selected memory cell 236' is selected for a data operation (e.g., read margin determination) and a current $I_R$ (e.g., a read current) flows through the memory cell 236'. As one example, the voltage potentials may be a read voltage with $V_1$ applying +2V to selected row conductor 155 and $V_2$ applying −2V to selected column conductor 157, such that a potential difference across selected memory cell 236' is approximately 4V. The remaining row conductors 155 and column conductors 157 are unselected and may be electrically coupled with some nominal voltage potential such as ground, or may be allowed to float. In that $V_2$ is applied to only one of the terminals of each of the un-selected memory cells 236u, a potential difference (e.g., ≈2V) is applied across the un-selected memory cells 236u and generates a leakage current $I_L$ that flows through each cell 236u. A first current $I_1$ is approximately the sum of the leakage currents $I_L$ and the current $I_R$ (e.g., $I_1 \approx I_R + I_L$). A current mirror (not shown) or a current-to-voltage converter (I/V converter) (not shown) may be placed electrically in series with the selected column conductor 157 (e.g., at a node 224) to provide a signal that is the current or voltage equivalent of the first current $I_1$. That signal may be used to charge the capacitor 234 from a reference level to a first voltage level during the first cycle. One skilled in the art will appreciate that the direction of current flow in FIG. 2B will depend on the magnitude and polarity of the voltages $V_1$ and $V_2$.

Figure 2C:
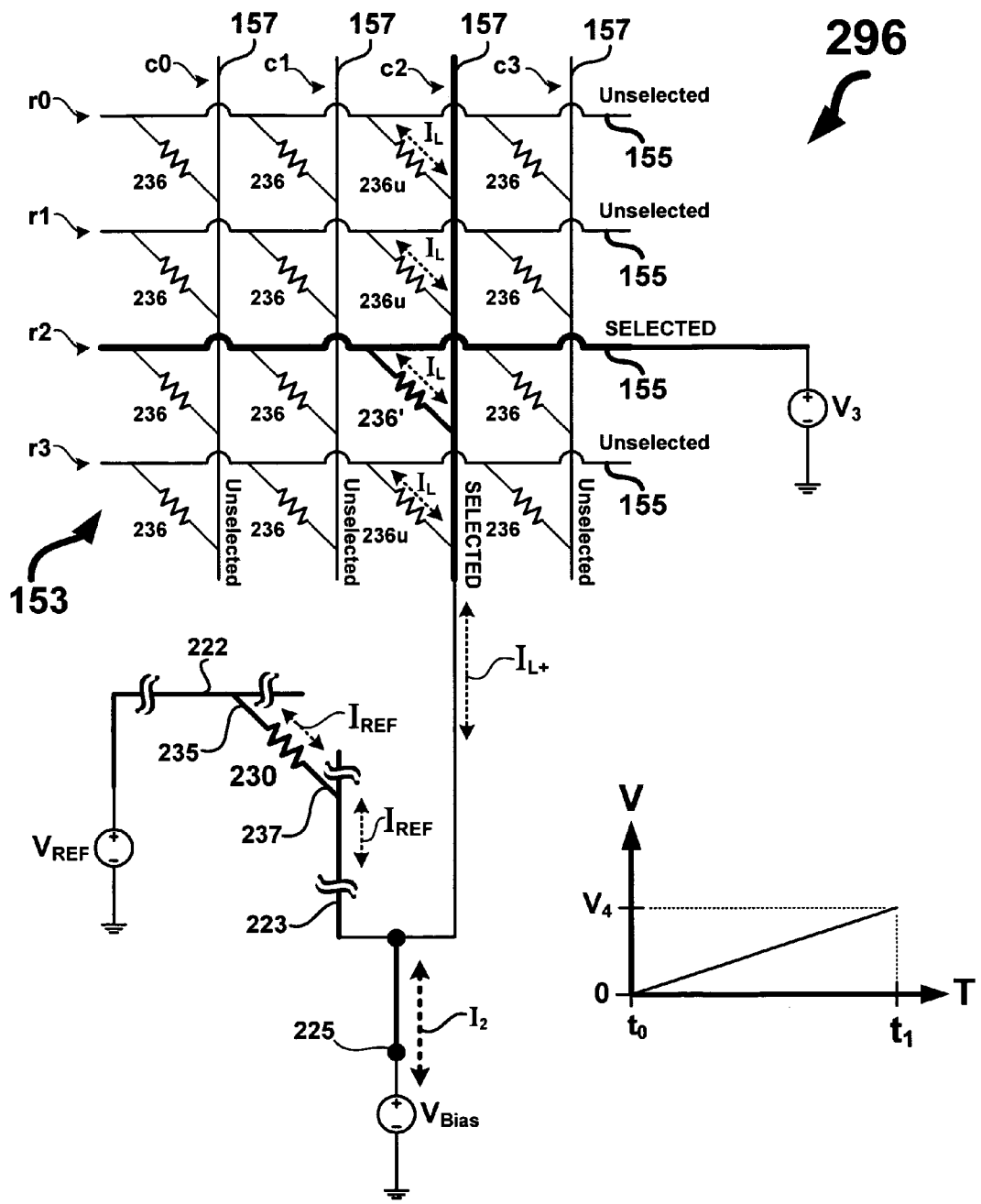
FIG. 2C depicts a schematic view of one example of a second memory structure during a second phase of the data operation for the array depicted in FIG. 2A.

Moving now to FIG. 2C, during a second phase of the data operation a second memory structure 296 includes the un-selected memory cells 236u and a reference cell 230 selected for the data operation. As one example of how the reference cell 230 can be selected for the data operation, terminal 235 is electrically coupled with a conductive line 222 and terminal 237 is electrically coupled with a conductive line 223. Conductive line 223 is electrically coupled with selected column conductor 157 and a voltage source $V_{Bias}$. Conductive line 222 is electrically coupled with a voltage source $V_{REF}$. The selected row conductor 155 is electrically coupled with a voltage source $V_3$ such that leakage currents $I_L$ flow through cells 236u and 236' and the sum of those current is denoted as total leakage current $I_{L+}$. A potential difference across the reference cell 230 also generates a reference current $I_{REF}$. A second current $I_2$ is the sum of the total leakage current $I_{L+}$ and the reference current $I_{REF}$ (e.g., $I_2 \approx I_{L+} + I_{REF}$). During the second phase, the second current $I_2$ can be used to discharge the capacitor 234 to a second voltage. A current mirror (not shown) or an I/V converter (not shown) may be placed electrically in series with the selected column conductor 157 (e.g., at a node 225) to provide a signal that is the current or voltage equivalent of the second current $I_2$. The voltage source $V_3$ may apply a potential such as a read voltage potential (e.g., 2V) to the row conductors 155. The voltage source $V_{Bias}$ may apply a substantially constant voltage potential. On the other hand, the voltage source $V_{Bias}$ may apply a voltage potential V that rises over time T from some lower voltage value (e.g., $\approx$0V or ground potential) to a higher voltage value (e.g. in a range from about 100 mV to about 200 mV) as depicted by a graph where the voltage potential applied by voltage source $V_{Bias}$ rises from 0V at a time $t_0$ to a voltage $V_4$ at a time $t_1$. The rise in voltage over time for $V_{Bias}$ need not be linear as depicted in FIG. 2C. The voltage source $V_{REF}$ may apply a potential that is substantially equal to that of voltage source $V_3$, some other voltage such as ground potential, or the terminal 235 of the reference cell 230 may be allowed to float.

Figure 2D:
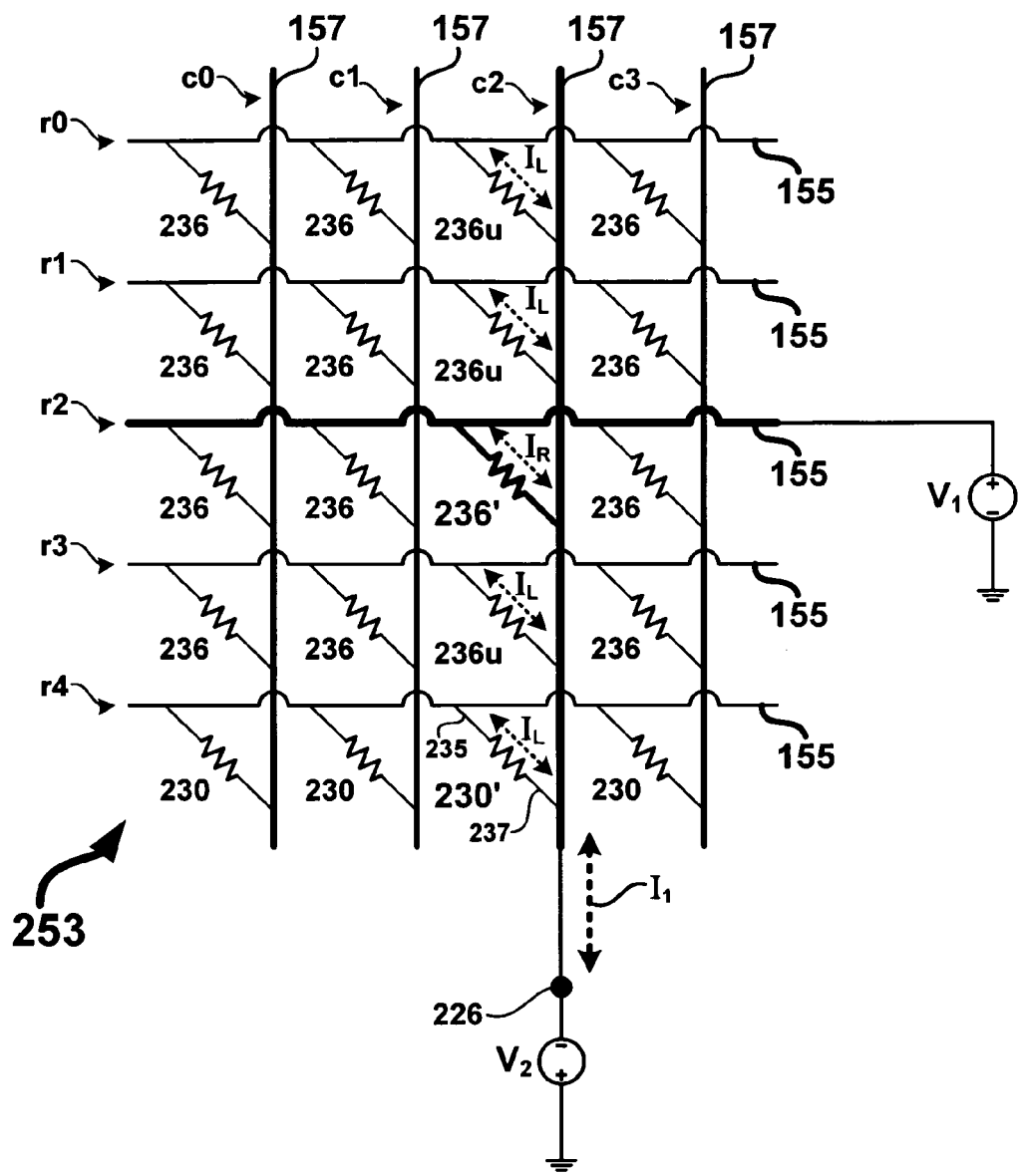
FIG. 2D depicts a schematic view of another example of a first memory structure during a first phase of a data operation to an array including a plurality of reference cells.
Figure 2E:
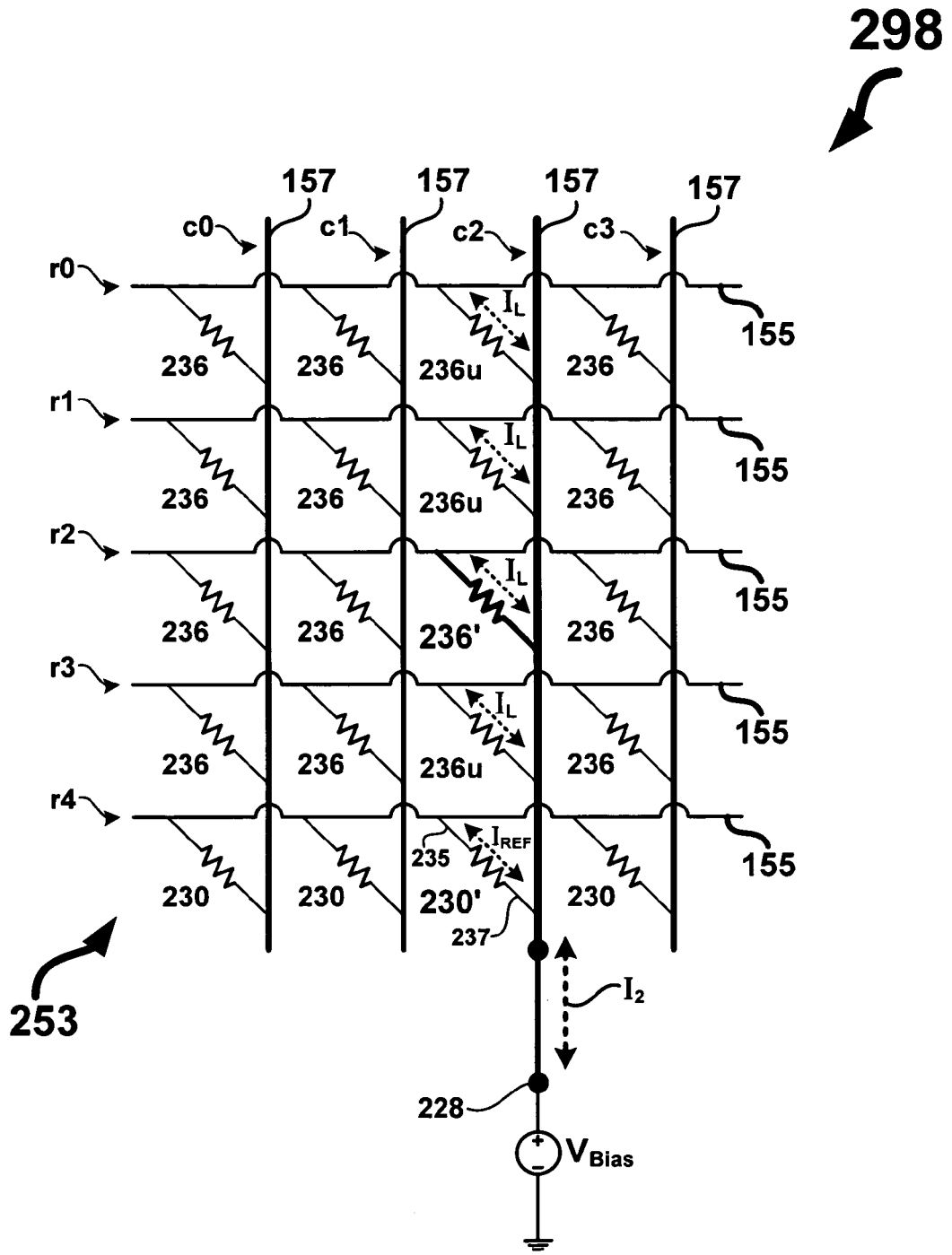
FIG. 2E depicts a schematic view of another example of a second memory structure during a second phase of read margin determination for the array depicted in FIG. 2D.

Referring now to FIGS. 2D and 2E, in an alternate embodiment, a two-terminal cross-point array can include a plurality of reference cells 230 positioned in one or more rows or one or more columns of the array. In FIG. 2D, an array 253 includes a fifth row denoted as r4 having a plurality of reference cells 230 with each reference cell 230 having one terminal 235 in electrical communication with a single row conductor 155 and the other terminal 237 in electrical communication with a single column conductor 157. As was described above in reference to FIG. 2B, during a first phase of a data operation (e.g., a read margin determination), a first memory structure 297 includes a selected memory cell denoted as 236' positioned in row r2 and column c2. Other un-selected memory cells in the same column c2 as the selected memory cell 236' are denoted as 236u. Additionally, column c2 includes a reference cell denoted as 230' that is affected by the data operation to the selected memory cell as 236'. Each un-selected memory cell 236u and the reference cell 230', has one terminal electrically coupled with the same column conductor 157 as the selected memory cell 236' and the other terminal electrically coupled with a row conductor 155 that is different than the row conductor 155 for selected memory cell 236'. During the first phase, voltage potentials $V_1$ and $V_2$ are applied to the row and column conductors 155 and 157 (shown in heavy line) for r2 and c2 such that the selected memory cell 236' is selected for a data operation and a current $I_R$ flows through the memory cell 236'. As was described above, $V_1$ and $V_2$ may be +2V and −2V respectively. The remaining row conductors 155 and column conductors 157 are unselected and may be electrically coupled with some nominal voltage potential such as ground, or may be allowed to float. In that $V_2$ is applied to only one of the terminals of each of the un-selected memory cells 236u and the reference cell 230', a potential difference (e.g., $\approx$2V) is applied across the un-selected memory cells 236u and the reference cell 230'. As a result, a leakage current $I_L$ flows through cells 236u and 230'. A first current $I_1$ is approximately the sum of the leakage currents $I_L$ and the current $I_R$ (e.g., $I_1 \approx I_R + I_L$). A current mirror (not shown) or an I/V converter (not shown) may be placed electrically in series with the selected column conductor 157 (e.g., at a node 226) to provide a signal that is the current or voltage equivalent of the first current $I_1$. That signal may be used to charge the capacitor 234 from a reference level to a first voltage level during the first cycle. One skilled in the art will appreciate that the direction of current flow in FIG. 2D will depend on the magnitude and polarity of the voltages $V_1$ and $V_2$.

Moving now to FIG. 2E, during a second phase of the data operation a second memory structure 298 includes the un-selected memory cells 236u and the reference cell 230. Preferably, row conductors 155 are allowed to float. A voltage source $V_{Bias}$ is electrically coupled with the selected column conductor 157. Voltage source $V_{Bias}$ may apply a substantially constant voltage potential or, as was described above in reference to FIG. 2C, the voltage source $V_{Bias}$ may apply a voltage potential V that rises over time T from some lower voltage value to a higher voltage value as depicted by the graph in FIG. 2C, where the voltage potential applied by voltage source $V_{Bias}$ rises from 0V at a time $t_0$ to a voltage $V_4$ at a time $t_1$. The rise in voltage over time for $V_{Bias}$ need not be linear. Although the terminals electrically coupled with the row conductors 155 are floating, the application of $V_{Bias}$ to the selected column conductor 157 creates a potential difference across those cells and generates leakage currents $I_L$ in cells 236u and 236' and a reference current $I_{REF}$ in reference cell 230'. A second current $I_2$ is the sum of the total leakage current $I_{L+}$ and the reference current $I_{REF}$ (e.g., $I_2 \approx I_{L+} + I_{REF}$). During the second phase, the second current $I_2$ can be used to discharge the capacitor 234 to a second voltage. A current mirror (not shown) or an I/V converter (not shown) may be placed electrically in series with the selected column conductor 157 (e.g., at a node 228) to provide a signal that is the current or voltage equivalent of the second current $I_2$.

Referring again to FIG. 2, margin manager 201 can include a margin detector 202 and a margin restoration circuit 270. Further, margin manager 201 can include a capacitive element 234 coupled with sense amplifier 250, a switch 240 coupled with a reference memory cell 230 and the capacitive element 234, and a switch 242 coupled with the memory cell 236 and the capacitive element 234. Margin manager 201 can be configured to determine a rate at which a current flows from capacitive element 234, whereby the rate specifies whether the read margin for memory cell 236 is associated with a specified level of read margin. Thus, specified levels of read margin can be expressed as a function of time, such as capacitor discharge rates, and margin manager 201 can be configured to detect various capacitor discharge rates and determine whether any of the various capacitor discharge rates are indicative of one or more specified levels of read margin.

Further to FIG. 2, margin detector 202 can include a sampling controller 210, a sampler 212, and a margin determinator 218. In operation, sampling controller 210 can be configured to activate switch 240 during a first phase (e.g., of a read operation) to charge capacitive element 234 and to activate switch 242 during a second phase (e.g., of the read operation) to discharge capacitive element 234. In the first phase, reference memory cell 230 provides a reference signal via switch 240 to capacitive element 234, whereas memory cell 236 provides a signal via switch 242 to capacitive element 234 during a second phase. Sampler 212 can be configured to activate sense amplifier 250 multiple times during, for example, a read operation to perform contemporaneous reads and margin determinations. In at least some embodiments, margin determinator 218 can be configured to sense differences between a reference current from reference memory cell 230 and a current from memory cell 236, whereby margin determinator 218 can determine read margins based on the differences in currents (e.g., as perceived or detected, based on the charge and discharge rates of capacitive element 234).

Capacitive element 234 can be at least one capacitor, an inherent and/or parasitic capacitance of at least one or more of the array lines (e.g., 155 and/or 157), at least one memory cell 236, at least one reference memory cell 230, or any other structure capable of storing charge. For example, the memory cell 236 and its associated electrodes can be used as the capacitive element 234 with the electrodes operative as the plates of the capacitor and the electrolytic tunnel barrier in contact with a conductive metal oxide (CMO) material or a mixed valence conductive oxide operative as the dielectric of the capacitor. In that a structure for the reference memory cell 230 can be substantially identical to that of the memory cells 236, the reference memory cell 230 can also be used as the capacitive element 234. In some embodiments, at least one reference memory cell 230 can be used to generate the reference signal (e.g., a reference current) and at least one other reference memory cell 230 can be used as the capacitive element 234. If a plurality of the reference memory cells 230 or a plurality of the memory cells 236 are used as the capacitive element 234, then they can be connected in parallel, in series, or in series/parallel combination to obtain the desired value of capacitance.

In operation, margin manager 201 can be activated in response to an access to memory layers 290, such as during a read operation. Once a read operation is active, margin manager 201 can be configured to receive a reference signal in association with reference memory cell 230. During one phase, sampling controller 210 can activate switch 240 to charge capacitive element 234 using the reference signal, such as a reference current $I_{REF}$. During another phase, sampling controller 210 can activate switch 242 to access capacitive element 234 by coupling memory cell 236 to capacitive element 234. In this phase, sampler 212 can be configured to sample a signal, such as a read current $I_{Read}$, associated with memory cell 236 at multiple points in time to generate signal samples, according to various embodiments. Sampler 212 activates sense amplifier 250 at the multiple points to generate the signal samples as capacitive element 234 is discharging. In at least one embodiment, sense amplifier 250 includes a single sense amplifier 250 to generate the signal samples. The single sense amplifier 250 can be electrically coupled with a single conductive array line such as a column line or a row line. The margin manger 201 and/or the sampling controller 210 can determine which phase occurs first in time.

Sampler 212 is configured to sample the signal coextensive (and/or substantially coextensive) with the sampling of a value (e.g., a logic value) representative of the stored data in memory cell 236 during a period of time. In at least some embodiments, sampler 212 can include a state sampler 214 and a margin sampler 216. State sampler 214 can be configured sample the signal associated with memory cell 236 at a specific point (or multiple points) in time at which sense amplifier 250 can sense the value of the stored data in memory cell 236. Therefore, state sampler 214 can sample the value of data stored in memory cell 236 via path 252 to determine a "read sample" as part of a read operation, whereby the read sample represents the read data (e.g., as sensed by sense amplifier 250). In one embodiment, the specific point (or multiple points) in time at which sense amplifier 250 senses the value of the stored data is determined as a function of the rate at which capacitive element 234 is charged. Margin sampler 216 can be configured to sample the signal via path 252 to determine "margin samples" at one or more times either prior to or subsequent to, or both (e.g., both before and after) the specific point (or multiple points) in time at which state sampler 214 samples the signal to read the value of the stored data.

Margin determinator 218 can be configured to interpret the signal samples generated by sampler 212 via path 243 to determine whether memory cell 236 is associated with a specified level of read margin for the value representative of the stored data. A signal sample can either be a read sample or a margin sample, or both. Margin determinator 218 can detect that the value representative of the stored data changes to another value during a period of time specified as the sampler 212 generates signal samples at multiple points in time. For example, if margin determinator 218 detects that the value representative of the stored data changes to another value during the period of time the signal samples are generated, then margin determinator 218 can identify that memory cell 236 does not have the specified level of read margin. In some embodiments, margin determinator 218 can determine magnitudes (or approximations thereof) for the signal samples, and then analyze whether the magnitudes for the signal samples are associated with a range of magnitudes for the specified level of read margin. For example, margin determinator 218 can determine that at least one of the magnitudes for the signal samples is not associated with the range of magnitudes. Since one or more magnitudes are not associated with the specified level of read margin, margin determinator 218 can determine that memory cell 236 does not have sufficient read margin (e.g., memory cell 236 is associated with either soft programmed or soft erased states).

Margin restoration circuit 270 can be configured to restore an association between memory cell 236 and a specified level of read margin. For example, margin restoration circuit 270 can cause memory access circuit 280 to generate a write operation to write (or re-write) the value of the stored data into memory cell 236 to ensure that a sufficient read margin is restored to memory cell 236. Margin restoration circuit 270 can be configured to restore the read margin to a specified level of read margin at any time, such as during the read operation or at any time subsequent thereto. In at least some embodiments, margin detector 202 can store data representing the magnitudes of the signal samples (e.g., 1,1,1, or 0,1,1) via path 260 in a sample repository, which, in some cases, can be part of memory layers 290. For example, a portion of the memory cells in one or more of the layers of memory can be used as data storage space for the sample repository. Margin restoration circuit 270 can be configured to retrieve the stored data via path 262 from a portion of a cross point array, such as in memory layers 290.

In at least some embodiments, read margins can be characterized by rates at which a current is discharged from a capacitor, whereby the rates can be graphically represented as different profiles. A determination whether a memory cell 236 has sufficient read margin (i.e., a specified level of read margin) can be made by comparing a profile for a rate at which the capacitor is discharged (subsequent to charging the capacitor with a current from the memory cell 236). Then, margin determinator 218 can determine whether the rate is associated with a group of rates that is indicative of a specified level of read margin. In some embodiments, margin restoration circuit 270 can be configured to restore a resistance value to the memory cell, whereby the restored resistance value provides for rates at which the current is discharged from the capacitor that are associated with the group of rates.

Note that reference memory cell 230 can be positioned within or without the one or more layers of memory 290 that include memory cell 236. In at least some embodiments, margin manager 201 can operate on every read access, or can be configured to operate during specific predetermined read operations (or can operate to perform random contemporaneous reads and margin determinations). In some cases, margin manager 201 can operate at the expiration of any time interval that is sufficient to detect and restore specified levels of margin. Although only one sense amp 250 is depicted in FIG. 2, portion 200 can include a plurality of sense amps (not shown) operative to provide page mode reads from a plurality of selected memory cells 236 during a read operation. The circuitry for the switches 240 and 242, and the capacitive element 234 can be replicated for determining read margins for n-bits of data (e.g., one or more bytes of data). Page mode reads can also be effectuated by a using single sense amp 250, switch 240, and capacitive element 234; however, the switch 242 is modified to selectively switch among a plurality of selected memory cells 236. For example, modified switch 242 can be activated by margin manager 201 to selectively switch from a first selected memory cell 236 to a second selected memory cell 236, and so on, to an "n-th" selected memory cell 236. As one example, the switch 242 can be configured to switch among eight memory cells 236 to effectuate a page mode read for a byte of data. For each selected memory cell 236, the switches 240 and 242 allow the read margin for the selected memory cell 236 to be determined as was described above. After the read margin for the currently selected memory cell 236 is determined, the switch 242 is activated to switch to the next memory cell 236 so that its read margin can be determined. The switch 242 is repeatedly activated until switched to the "n-th" selected memory cell 236 (e.g., the eighth cell for a byte of data).

Figure 3:
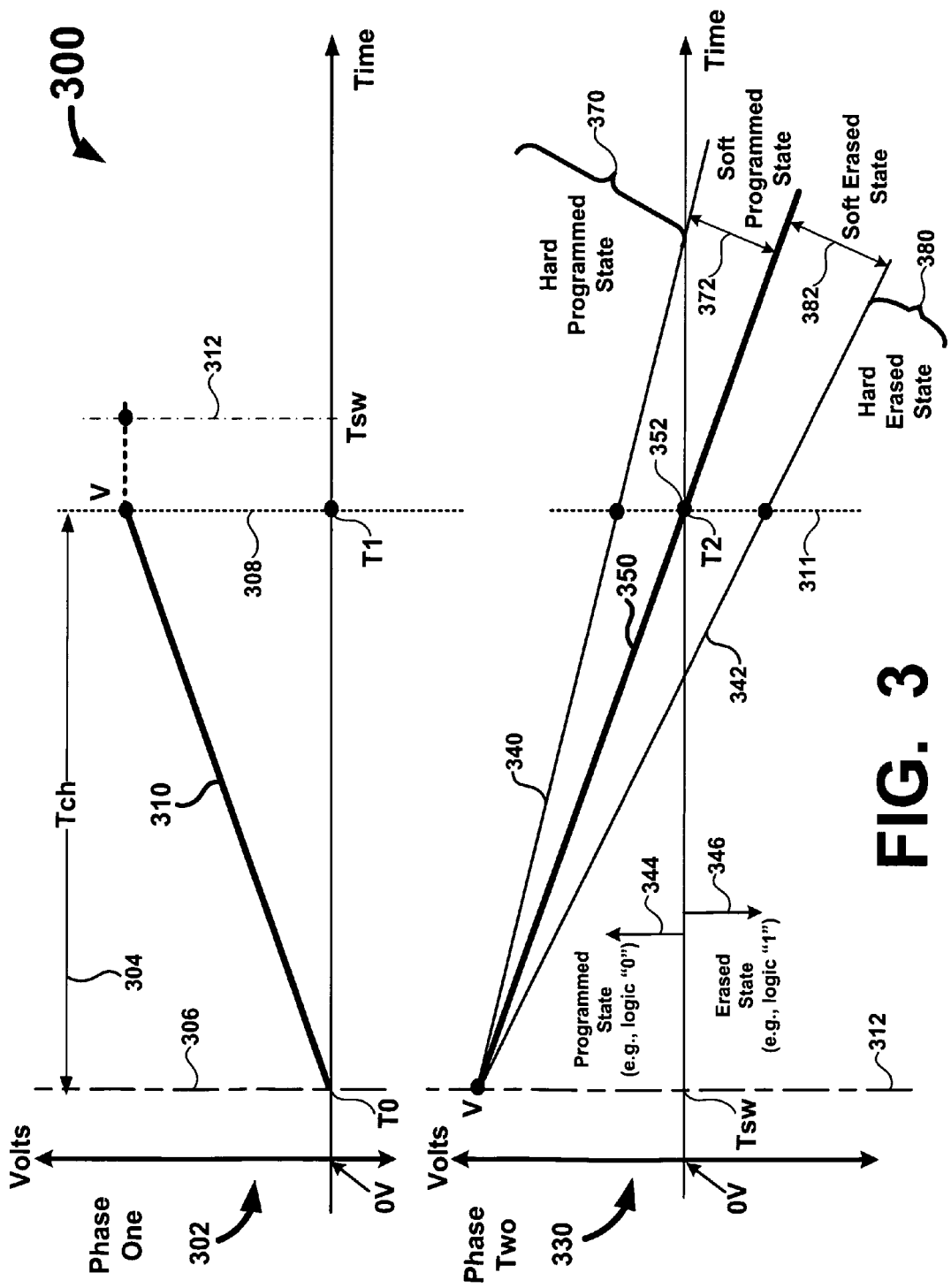
FIG. 3 is a diagram depicting charge and discharge rates as applied to read margin management.

FIG. 3 is a diagram 300 depicting charge and discharge rates as applied to read margin management, according to various embodiments of the invention. In this example, a graph 302 and a graph 330 respectively depict rates of charging a capacitive element during one phase and discharging the capacitive element during a subsequent phase. As shown in graph 302, the rate of charging a capacitive element is depicted as relationship 310 as expressed in volts over a time period ("Tch") 304, as determined from a time point ("T0") 306 to time point ("T1") 308. A reference cell can be accessed to supply the current that charges a capacitor according to graph 302. Time point ("Tsw") 312 can represent a point in time at which there is a switch from one phase to a subsequent phase. As shown in graph 330, the rate of discharging the capacitive element is depicted as relationship 350 as expressed in volts over the same time period ("Tch") 304, as determined from a time point ("Tsw") 312 to time point ("T2") 311, which is aligned with time point 308 for purposes of illustration. In at least one embodiment, time point ("Tsw") 312 represents a point in time when a sense amplifier switches to a margin sampling mode from a mode during which a reference cell is accessed. As shown, relationship 350 intersects 0 volts at time point ("T2") 311. In at least one embodiment, a sampler circuit can be configured to sample a signal at point 352 to determine the value of data (i.e., read data) being read out of a memory cell. Note, too, that a programmed state is associated with values 344 above 0 volts, whereas an erased state is associated with values 346 below 0 volts, both sets of values 344 and 346 being sensed by a sense amplifier to determine the values (i.e., a sense amplifier will generate a "0" if activated to sense a sample above 0 volts, and will generate a "1" if activated to sense a sample below 0 volts). Further to FIG. 3, a first line and a second line respectively represent a specified level 340 of read margin for a programmed state (e.g., "0") and a second specified level 342 of read margin for an erased state (e.g., "1"). Thus, a margin detector can be configured to determine a read margin for a memory cell by determining a profile (e.g., a discharge rate profile for a cell under a read operation) and matching it against specified levels 340 and 342 of read margin to determine whether the read margin for the memory cell is sufficient. If a margin detector determines that a profile is within region 370, then the programmed state is a hard programmed state and the margin need not be restored; whereas if a margin detector determines that the profile is within region 372, then the programmed state is a soft programmed state and the margin likely will need to be restored. The margin detector can similarly operate to determine whether the profile is within regions 380 and 382, which respectively specify a hard erased state and a soft erased state 382. If the profile is determined to be associated with regions 372 or 382, a margin restoration circuit can restore the read margins to re-associate the profile with regions 370 or 380, respectively, thereby ensuring that, for example, the resistance value associated with the memory cell is restored. In one embodiment, time point ("T2") 311 is substantially equal in length to time point ("T1") 308. If the charge rate of the capacitive element during phase one is substantially equal to the discharge rate of the capacitive element during phase two, then $I_{REF}$ (e.g., current generated by the reference cell) and $I_{READ}$ (e.g., current generated by the selected memory cell) are substantially equal to each other.

Figure 4:
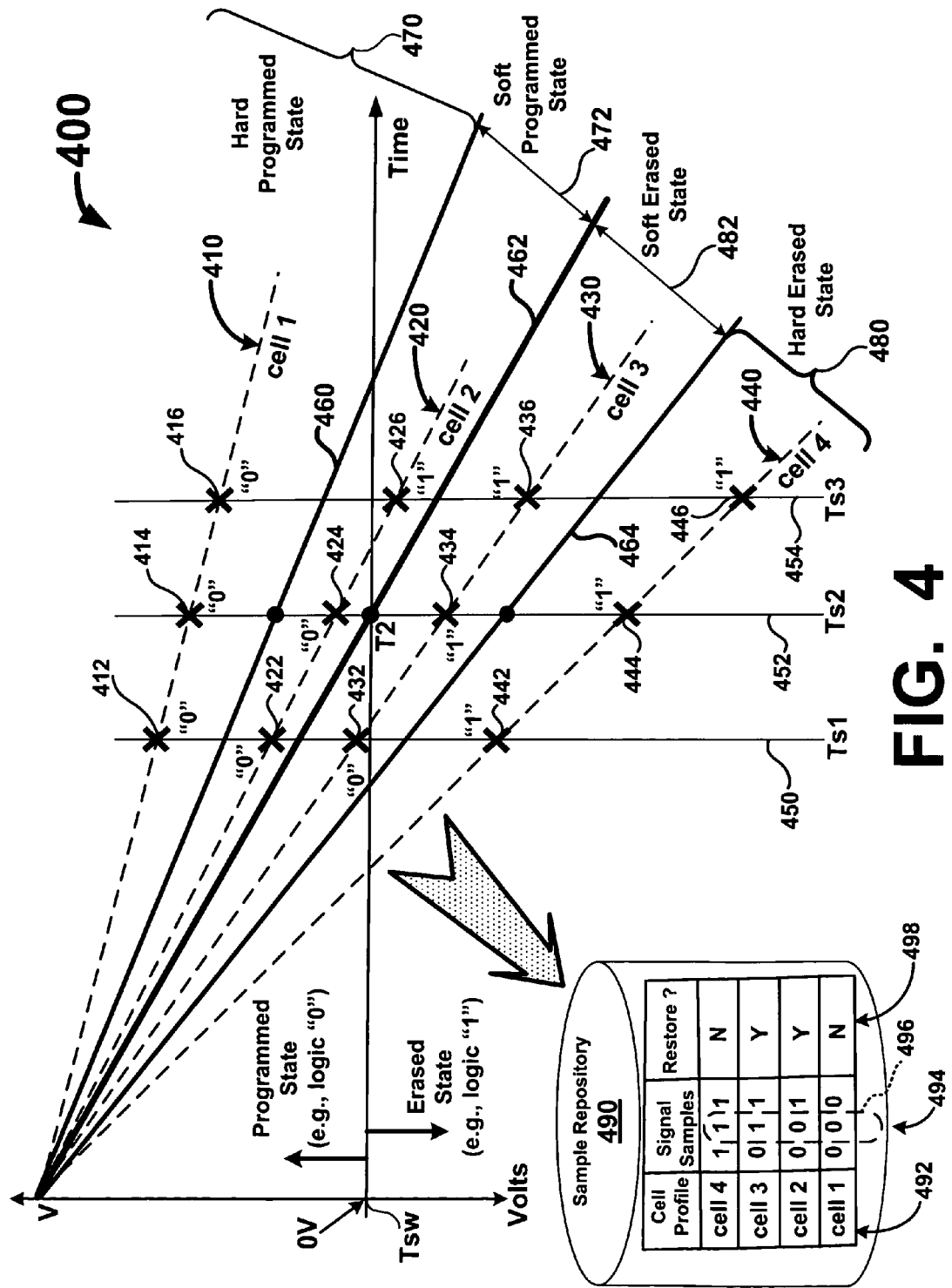
FIG. 4 is a diagram depicting the generation of signal samples for determining margins.

FIG. 4 is a diagram 400 depicting the generation of signal samples for determining margins, according to various embodiments of the invention. In this example, a line 462 depicts a discharging rate during phase two, with a programmed state read margin 460 and an erased state read margin 464. To illustrate the generation of signal samples, consider that four different cells in an array have four different rate profiles. For example, cell 1 has a profile 410, cell 2 has a profile 420, cell 3 has a profile 430, and cell 4 has a profile 440, where each profile indicates a relative strength of the read margins among the profiles. A sampler can be configured to sample the signals at time ("Ts1") 450, time ("Ts2") 452, and time ("Ts3") 454 to form rate profiles (e.g., the rate at which a capacitor is discharged). Sampling profile 410 depicts 3 samples: sample 412 (e.g., a margin sample), sample 414 (e.g., a read sample), and sample 416 (e.g., a margin sample), all of which have values of "0." The signal samples can be stored in a sample repository 490 in a field 494 labeled "signal samples" and associated with an identifier ("Cell 1") 492. A margin detector can determine that since samples 412, 414 and 416 did not change values during the sampling period, those samples are in a hard programmed state region 470. Thus, cell 1 does not require restoration, and indication ("N," for "no") is stored in field 498. A margin restoration circuit can detect the indications of "Y" and "N," and can select to restore those cells associated with "Y" (for Yes), while foregoing margin restoration for those associated with "N." Sampling profile 420 depicts 3 signal samples: signal sample 422 (e.g., a margin sample), signal sample 424 (e.g., a read sample), and signal sample 426 (e.g., a margin sample). Note that while signal samples 422 and 424 have values of "0," signal sample 426 indicates that profile 420 changes to a value to "1." As signal samples 422 to 426 relate to a soft programmed state region 472, a margin detector can be configured to note this in field 498 for cell 2. With a "Y" indication stored in field 498, cell 2 will undergo a margin restoration process (not shown). Sampling profiles 430 and 440 depict signal samples 432 to 436 and signal samples 442 to 446, respectively. Further, sampling profiles 430 and 440 also are associated with soft erased state region 482 and hard erased state region 480, respectively. The particulars of signal samples 432-436 and signal samples 442-446 can be stored in sample repository 490. Note that center numbers 496 represent read samples that include values read out of the memory cells.

Figure 5:
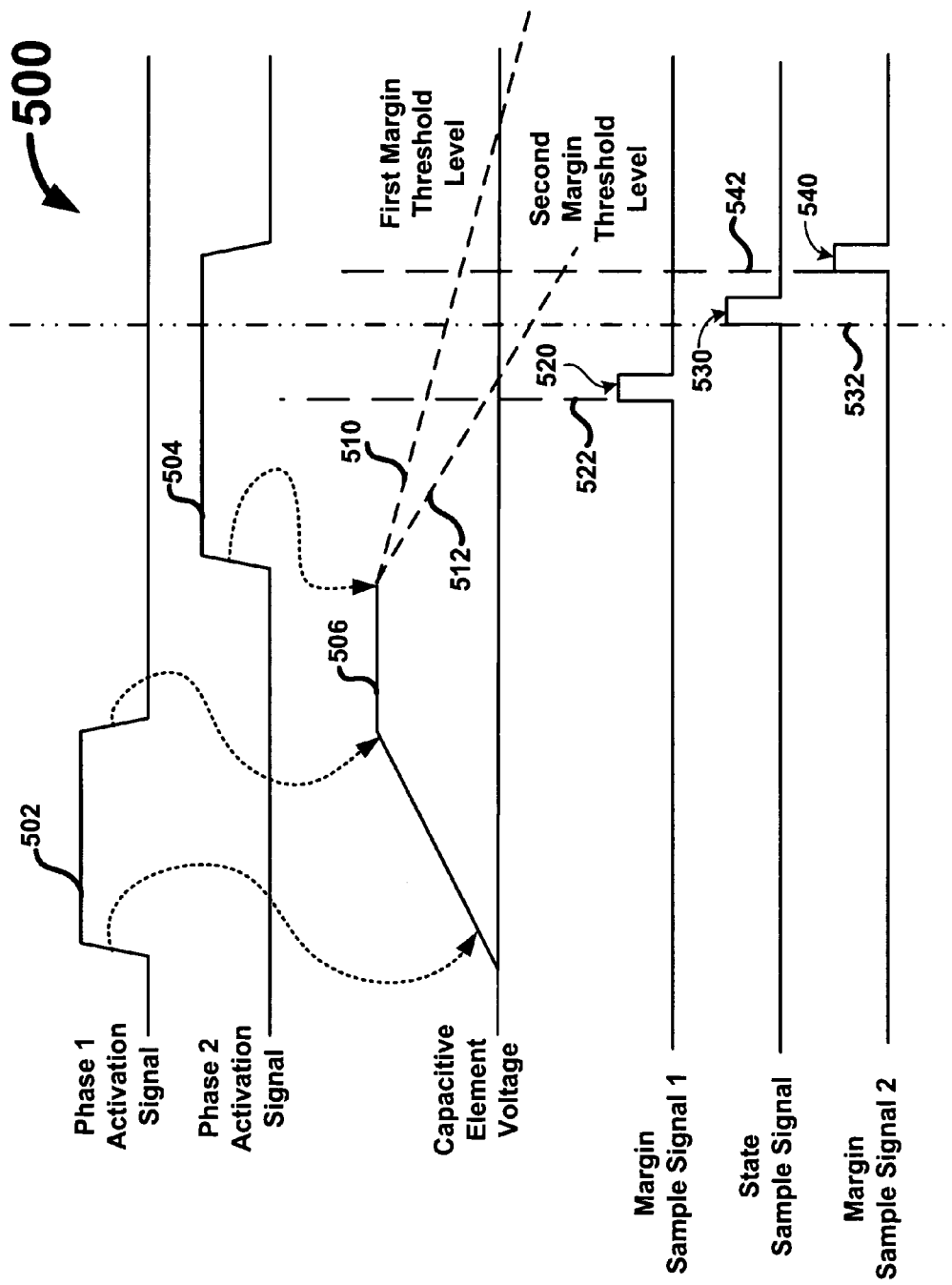
FIG. 5 is a timing diagram depicting the sampling of signals.

FIG. 5 is a timing diagram 500 depicting the sampling of signals, according to various embodiments of the invention. Signal 502 triggers the charging of a capacitive element during phase one, as shown by capacitive element voltage 506. Signal 504 initiates phase two by discharging the capacitive element at a rate (not shown) that can be compared to a first margin threshold level 510 and a second margin threshold level 512. Sampling signals 520, 530, and 540 respectively trigger the sampling of the discharge rate of the capacitive element at time 522, time 532, and time 542. In some embodiments, sampling signals 520, 530, and 540 control activation of a sense amplifier to capture signal samples.

Figure 6:
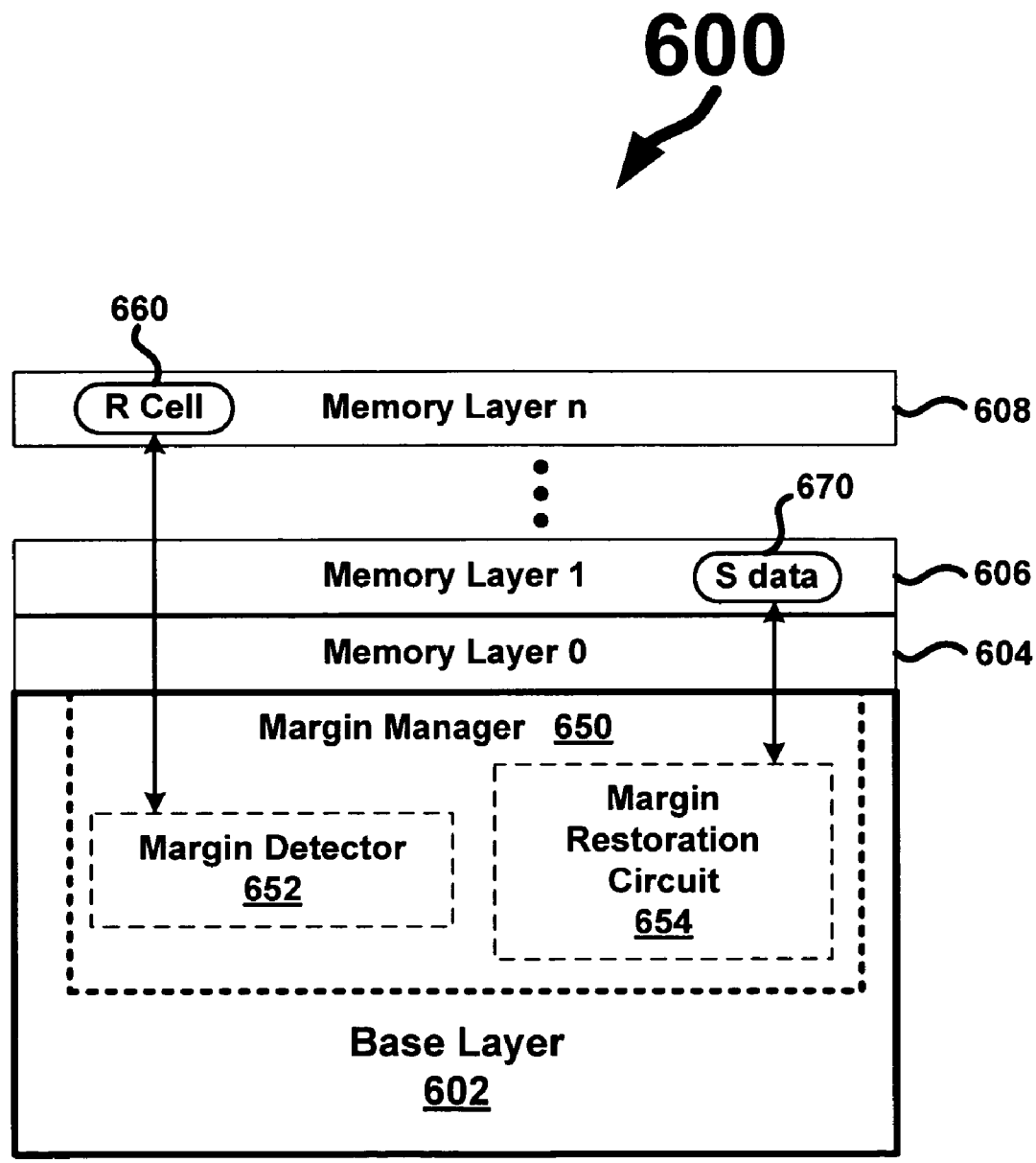
FIG. 6 depicts a cross-sectional view of an example of an integrated circuit implementing a margin manager.

FIG. 6 depicts a cross-sectional view of an example of an integrated circuit implementing a margin manager, according to one embodiment of the invention. Cross-section view 600 shows multiple memory layers being vertically disposed above a base layer 602, which can include logic circuitry for reading data from memory cells as well as detecting the margins for those memory cells, and a semiconductor substrate (e.g., a silicon wafer) upon which the logic circuitry (e.g., CMOS circuitry) can be formed. The logic circuitry, for example, can include a margin manager 650 including a margin detector circuit 652 and a margin restoration circuit 654. Multiple memory layers can include a first layer 604, a second layer 606 and an "nth" layer 608 of third dimension memory. In various embodiments, reference memory cells ("R Cell") 660 can be implemented anywhere in memory layers 604 to 608. Similarly, sample data cells ("S data") can be implemented anywhere in memory layers 604 to 608.

Figure 7:
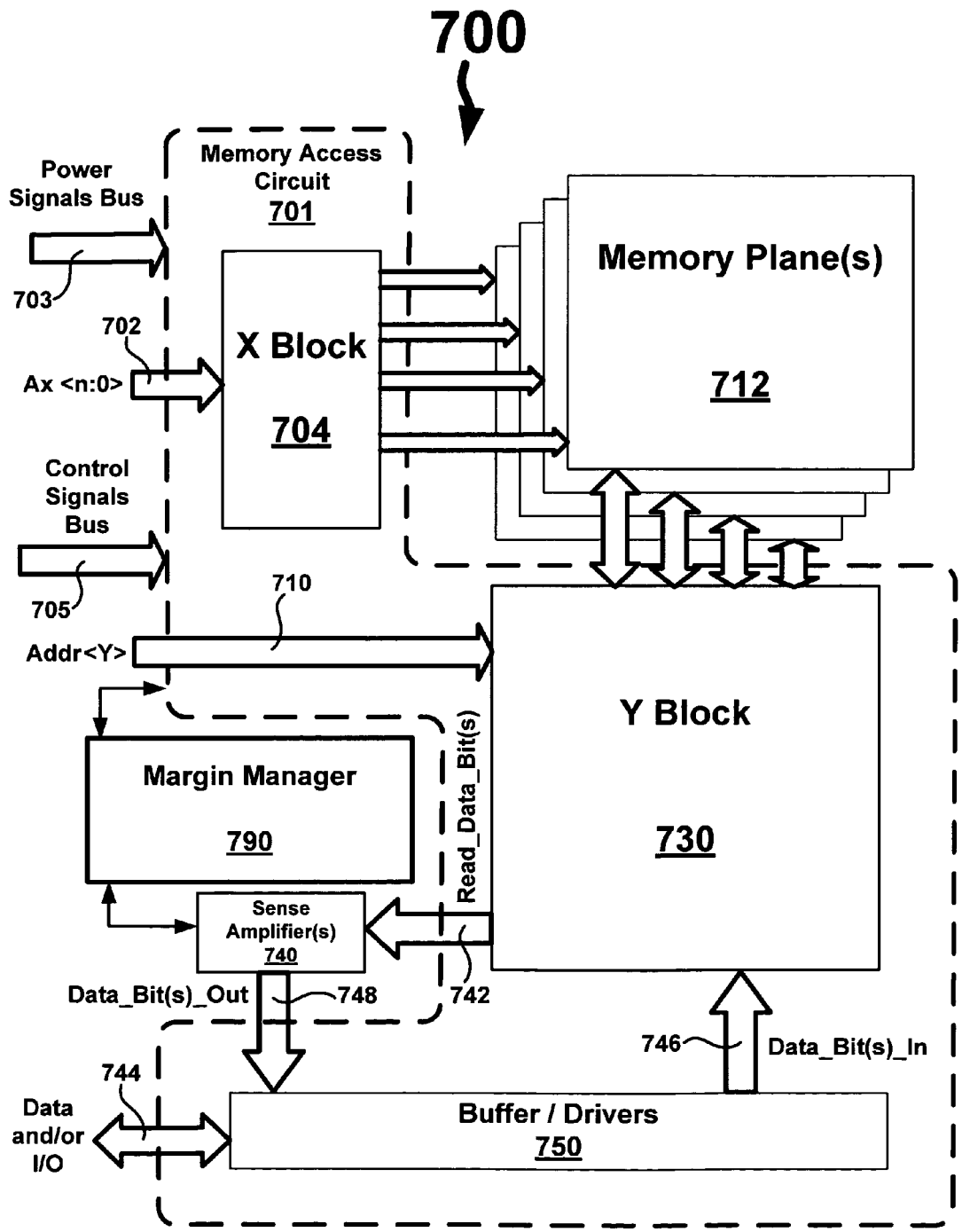
FIG. 7 depicts a block diagram of a memory access circuit implementing a representative margin manager to reduce effects of memory disturbs in association with read margins.

FIG. 7 is a block diagram 700 depicting a memory access circuit implementing a representative margin manager to reduce effects of memory disturbs in association with read margins, according to various embodiments of the invention. According to an example of the invention, margin manager 790 is configured to operate in connection with memory access circuit 701 to restore read margins. Memory access circuit 701 is shown to include an X Block 704, a Y Block 730, one or more sense amplifiers 740, and a set of buffers and/or drivers ("Buffers/Drivers") 750. Note that while FIG. 7 shows X Block 704 and Y Block 730 respectively, the functionality and/or the structure of margin manager 790 can be disposed external to X Block 704 and Y Block 730.

Memory access circuit 701 can be coupled with a control signals bus 705—to receive control signals, such as signals that enable read or write access. Further, memory access circuit 701 can be coupled with a power signals bus 703 to receive control signals. Memory access circuit 701 can be coupled with an address bus (not shown) to receive at least one subset of addresses ("Ax<n:0>") 702 of addresses destined for X Block 704 for selecting a horizontal array line (i.e., an "X Line"), and at least another subset of addresses ("Addr<Y>") 710 destined for Y Block 730 for applying specific access voltages on specific vertical lines (i.e., "Y Lines"). Data bus 744 is coupled with memory access circuit 701 to exchange data with memory plane(s) 712. X Block 704 can include an address decoder (e.g., a predecoder and an X-decoder) for determining which X-Line to access. Y Block 730 also can include another address decoder (e.g., a predecoder and a Y-decoder) for determining a Y-Line. In operation, drivers in Buffers/Drivers 750 can generate write and read voltage signals respectively that are operative to write data into (e.g., Data_Bit(s)_In 746), and to read data from (e.g., Read_Data_Bits(s) 742), memory plane(s) 712. Sense amplifiers 740 operate on the Read_Data_Bits(s) 742 and generate Data_Bit(s)_Out 748 which may be buffered and stored in registers before being output as signals on Data bus 744. Data bus 744 may be used for other signal functions, such as communicating I/O, for example.

In view of the foregoing, a margin restoration circuit of margin manager 790 can control memory access circuit 701 to write (or re-write) values into memory cells that are not associated with a specified level of read margin, such as in cases where the memory cells are either in a soft programmed state or in a soft erased state.

Figure 8:
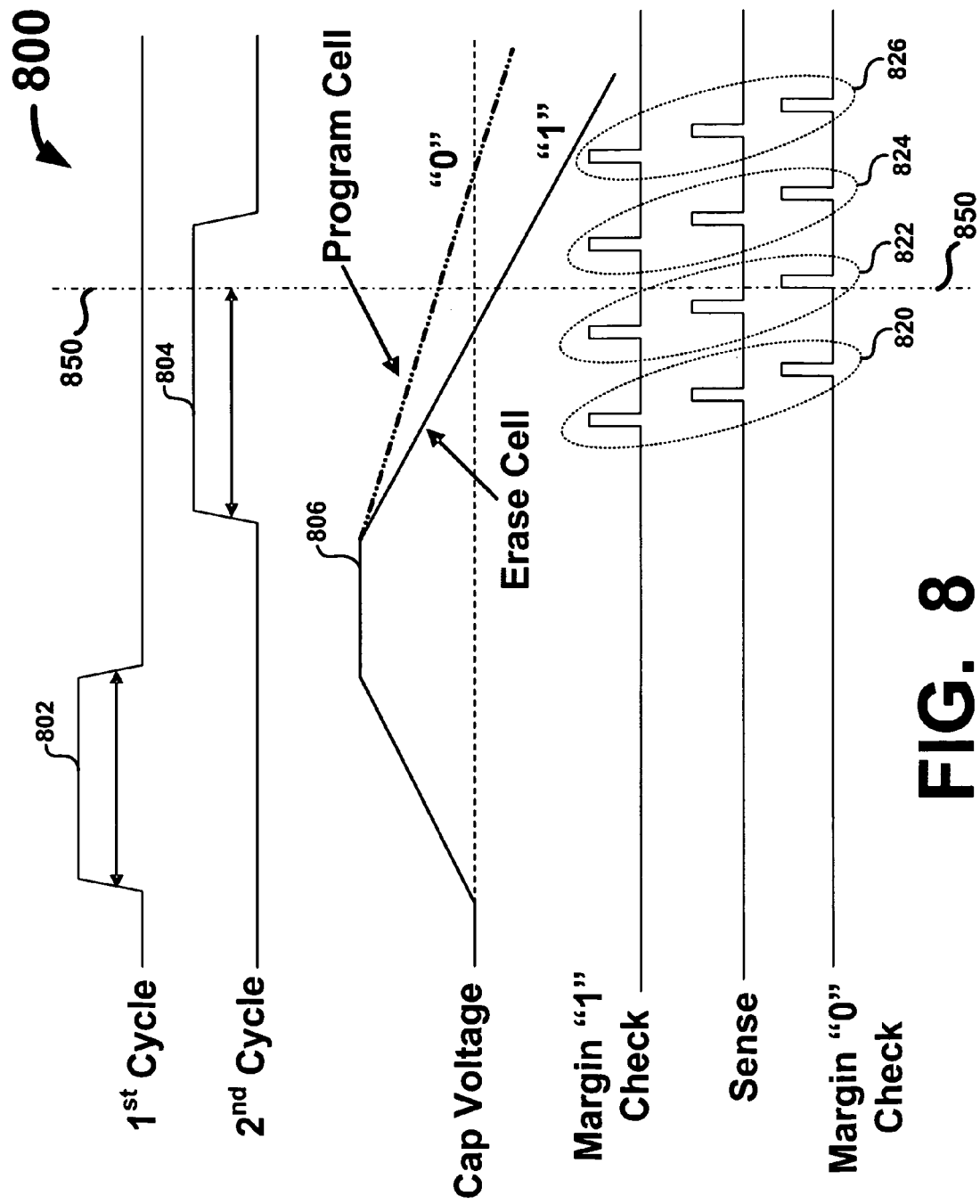
FIG. 8 is a timing diagram depicting management of margins for multi-level cells.

FIG. 8 is a timing diagram 800 depicting the management of margins for multi-level cells, according to various embodiments of the invention. A multi-level cell ("MLC") is a memory element capable of storing more than a single bit or unit of information, and diagram 800 presents an example of contemporaneous read operations and margin verification operations for multi-level cells. As shown, signal 802 triggers the charging of a capacitive element, as shown by the ramping up of capacitive element voltage 806. Groups of sampling signals 820, 822, 824, and 826 are timed to activate a sense amplifier at certain specific points in time to capture margin samples and read samples about a time point 850 (depicted as a dashed line).

FIG. 9 is an exemplary state table 900 for the timing diagram depicted in FIG. 8, according to various embodiments of the invention. Table 900 illustrates a cell state 920 for corresponding sequential sensing samples 910 captured according to timing diagram 800 of FIG. 8. The aforementioned group of sampling signals 820, 822, 824, and 826 of FIG. 8 are configured to capture samples shown in groups, 930, 932, 934, and 936, respectively. Further, cell state 920 can also include an indication (e.g., a bit of data) as to whether margin restoration is required (e.g., "need restore," to indicate that restoration is needed). In some embodiments, state table 900 can be stored in a sample repository (not shown). A portion of one or more memory arrays on one or more memory layers can be used for the sample repository.

The various embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. An integrated circuit, comprising:
    a non-volatile two-terminal cross-point memory array including a plurality of two-terminal memory cells, each two-terminal memory cell operative to store data as a plurality of conductivity profiles; and
    a substrate including active circuitry in electrical communication with the non-volatile two-terminal cross-point memory array, the non-volatile two-terminal cross-point memory array is fabricated over the substrate and is in contact with the substrate, the active circuitry including:
- a memory access circuit configured to select at least one of the plurality of two-terminal memory cells for a read operation,
- a sensing circuit configured to sense a data signal from selected two-terminal memory cells, the data signal indicative of stored data in selected two-terminal memory cells, and
- a margin manager circuit configured to manage a read margin for selected two-terminal memory cells substantially during the read operation and operative to determine if a value of the stored data in selected two-terminal memory cells is within a specified level of the read margin.

2. The integrated circuit of claim 1, wherein each two-terminal memory cell includes an electrolytic tunnel barrier in contact with and electrically in series with a mixed valence conductive oxide.

3. The integrated circuit of claim 1, wherein each two-terminal memory cell includes an electrolytic tunnel barrier in contact with and electrically in series with a conductive metal oxide (CMO).

4. The integrated circuit of claim 1, wherein the margin manager circuit is further configured to determine that the value of the stored data is associated with a first range of resistance values that specify the read margin for the selected two-terminal memory cells.

5. The integrated circuit of claim 4, wherein the first range of resistance values are indicative of a hard state for the stored data.

6. The integrated circuit of claim 5, wherein the hard state comprises
- a hard programmed state for the stored data if the data signal from the sensing circuit is indicative of a value of zero, or
- a hard erased state for the stored data if the data signal from the sensing circuit is indicative of a value of one.

7. The integrated circuit of claim 1, wherein the margin manager circuit is further configured to determine that the value of the stored data is associated with a second range of resistance values that specify the read margin for the selected two-terminal memory cells.

8. The integrated circuit of claim 7, wherein the second range of resistance values are indicative of a soft state for the stored data.

9. The integrated circuit of claim 8, wherein the soft state comprises
- a soft programmed state for the stored data if the data signal from the sensing circuit is indicative of a value of zero, or
- a soft erased state for the stored data if the data signal from the sensing circuit is indicative of a value of one.

10. The integrated circuit of claim 7, wherein the margin manager circuit is operative to restore the read margin for selected two-terminal memory cells by changing an association of the selected two-terminal memory cells from the second range of resistance values to a first range of resistance values.

11. The integrated circuit of claim 1, wherein the margin manager circuit is operative to manage the read margin as a function of time.

12. The integrated circuit of claim 1 and further comprising:
- a capacitance element electrically coupled with the sensing circuit,
- wherein the margin manager circuit is further configured to determine a rate of current flow to or from the capacitance element, the rate of current flow is indicative of whether the read margin for selected two-terminal memory cells is associated with a specified level of read margin.

13. The integrated circuit of claim 1, wherein the sensing circuit further comprises
- a sense amplifier including an input and an output, and
- a capacitor including a first node electrically coupled with the input and a second node electrically coupled with a first potential.

14. The integrated circuit of claim 13 and further comprising:
- a two-terminal non-volatile reference memory cell operative to generate a reference signal in response to reference voltage applied across the terminals of the reference memory cell;
- a first switch in electrical communication with the margin manager circuit and operative to electrically couple one of the terminals of the reference memory cell with the first node of the capacitor in response to a first signal activated by the margin manager circuit; and
- a second switch in electrical communication with the margin manager circuit and operative to electrically couple one of the terminals of a selected two-terminal memory cell with the first node of the capacitor in response to a second signal activated by the margin manager circuit,
- wherein the margin manager circuit is operative to activate the first switch during a first phase of a read operation to charge the capacitor and to activate the second switch during a second phase of the read operation to discharge the capacitor.

15. The integrated circuit of claim 14, wherein the margin manager circuit further comprises
- a margin detector configured to activate the sense amplifier to sense a difference between the reference signal and the data signal,
- wherein the margin detector is configured to activate the sense amplifier a plurality of times to sense the difference between the reference signal and the data signal.

16. The integrated circuit of claim 15, wherein the margin detector is configured to determine whether the read margin for the selected two-terminal memory cell is within the specified level of the read margin based on a magnitude of the difference between the reference signal and the data signal.

17. The integrated circuit of claim 16, wherein the margin manager circuit further comprises
- a margin restoration circuit configured to re-write the value of the stored data to the selected two-terminal memory cell to restore the read margin to the specified level of the read margin.

* * * * *